United States Patent [19]

Anderson et al.

[11] Patent Number: 5,380,584
[45] Date of Patent: Jan. 10, 1995

[54] IMAGING ELEMENT FOR USE IN ELECTROSTATOGRAPHY

[75] Inventors: Charles C. Anderson; David F. Jennings, both of Penfield; Gerald M. Leszyk, Spencerport; David A. Niemeyer, Rochester, all of N.Y.

[73] Assignee: Eastman Kodak Company, Rochester, N.Y.

[21] Appl. No.: 65,978

[22] Filed: May 21, 1993

[51] Int. Cl.[6] .............................................. B32B 5/16
[52] U.S. Cl. .................................. 428/323; 428/411.1; 428/480; 430/324; 430/903; 355/289
[58] Field of Search .................... 428/323, 411.1, 480, 428/913, 914, 514, 515, 518, 520; 430/324, 111, 903; 355/289, 245; 219/216; 162/164.3, 168.3

[56] References Cited

U.S. PATENT DOCUMENTS

| 4,919,757 | 4/1990 | Ohmar et al. | 162/164.3 |
|---|---|---|---|
| 5,194,356 | 3/1993 | Sacripante et al. | 430/106.6 |
| 5,296,898 | 3/1994 | Rubin et al. | 355/245 |

*Primary Examiner*—Patrick J. Ryan
*Assistant Examiner*—William A. Krynski
*Attorney, Agent, or Firm*—Alfred P. Lorenzo

[57] ABSTRACT

An electroconductive imaging element, that is especially useful in a high speed laser printing process utilizing electrostatography, is comprised of an insulating support, an electrically-conductive layer overlying the support and a thermoplastic dielectric imaging layer overlying the electrically-conductive layer. The electrically-conductive layer, which is comprised of at least 3 milligrams per square meter of a colloidal gel of vanadium pentoxide dispersed in a polymeric binder combines a high degree of transparency with a high degree of electrical conductivity. The thermoplastic dielectric imaging layer has a thickness of at least 0.2 micrometers and a surface resistivity of at least $10^{13}$ ohms/square and is comprised of a thermoplastic polymer with a glass transition temperature of at least 20° C.

16 Claims, No Drawings

IMAGING ELEMENT FOR USE IN ELECTROSTATOGRAPHY

FIELD OF THE INVENTION

This invention relates in general to electrostatography and in particular to a novel imaging element for use in an electostatographic imaging process. More specifically, this invention relates to an electroconductive imaging element that is especially adapted to receive a uniformly deposited layer of toner particles which are used in image formation and to imaging processes utilizing such an electroconductive element.

BACKGROUND OF THE INVENTION

A useful method of electrostatographic imaging involves the deposition of a uniform layer of toner particles on the surface of an electroconductive element, followed by imagewise heating of the toner particles to tack them to the surface of the element, removal of the toner particles from the non-image areas, and subsequent fusing of the imagewise distribution of toner particles to form the desired image. The toner particles carry an electrostatic charge, whereby they are attracted to the electroconductive element by electrostatic forces. To be useful in such a process, the electroconductive element must exhibit an adequate degree of electrical conductivity combined with surface characteristics which facilitate uniform deposition of the layer of toner particles and effective adherence of the toner particles in the desired imagewise distribution.

The electroconductive element must also exhibit excellent transparency to both visible and UV light since a preferred application for the imaging element is as a reproduction image master for exposing, for example, lithographic printing plates. Since the apparatus used to expose lithographic printing plates typically utilizes lamps which emit visible and, especially, UV light an image master which has poor visible and UV light transparency will result in excessively long exposure times.

Electroconductive elements for use in the aforesaid electrostatographic imaging process can be comprised of an insulating support, such as a polyethylene terephthalate film, an electrically-conductive layer overlying the support, and a layer of a thermoplastic polymer overlying the electrically-conductive layer. Toner particles can be uniformly deposited over the surface of the layer of thermoplastic polymer by suitable applicator means, such as an electrically-biased magnetic brush applicator, and imagewise exposed by suitable heating means, such as a laser, that will tack the particles to the surface and then the element can be cleaned of unexposed toner particles by suitable means such as the vacuum sweeper device described in U.S. Pat. No. 3,410,203, issued Nov. 12, 1968, or the magnetic brush cleaning apparatus described in U.S. Pat. No. 5,138,388, issued Aug. 11, 1992. The electrically conductive layer permits the use of a suitable bias voltage during application of the uniform layer of toner particles and during removal of the excess toner particles.

It is particularly difficult in preparing an electroconductive element of the type described hereinabove to simultaneously meet the strict requirements for conductivity and transparency in the electrically-conductive layer.

A wide variety of electrically-conductive materials have been proposed for use in forming electrically-conductive layers in imaging elements. While many of them are capable of meeting one or more of the requirements of this invention, it is extremely difficult to simultaneously meet all of the requirements.

Conductive layers comprising ionically conductive materials such as inorganic salts, colloidal silicas, polymeric salts such as styrene sulfonic acid salt homopolymers and interpolymers are well known in the art. These materials may provide very transparent coatings. However, the conductivity of such materials is very humidity sensitive and at low humidity they are not sufficently conductive for the application of the present invention.

Conductive layers comprising semiconductive metal salts such as cuprous iodide described in U.S. Pat. Nos. 3,245,833, 3,428,451, and 5,075,171, for example, reportedly provide resistivities less than $1 \times 10^7$ $\Omega$/sq. However, these conductive layers have significant absorption to UV light and are therefore not desirable for use in the present invention. In addition, these cuprous iodide layers are typically applied from harmful solvents such as acetonitrile, which also makes them undesirable.

Conductive layers comprising inherently conductive polymers such as polyacetylenes, polyanilines, polythiophenes, and polypyrroles are described in U.S. Pat. No. 4,237,194, JP A2282245, and JP A2282248, but, these layers are highly colored, and thus unsuitable for use in this invention.

Conductive fine particles of crystalline metal oxides dispersed with a polymeric binder have been used to prepare humidity insensitive, conductive layers for various imaging applications. Many different metal oxides are alleged to be useful as antistatic agents in photographic elements or as conductive agents in electrographic elements in such patents as U.S. Pat. Nos. 4,275,103, 4,394,441, 4,416,963, 4,418,141, 4,431,764, 4,495,276, 4,571,361, and 4,999,276. Preferred metal oxides are antimony-doped tin oxide, aluminum-doped zinc oxide, and niobium-doped titanium oxide. However, these materials do not provide acceptable performance characteristics in the demanding application of the present invention. In order to obtain high electrical conductivity, a large amount (100–10000 mg/m$^2$) of metal oxide must be included in the conductive layer. This results in decreased transparency for thick conductive coatings. The high volume fraction of the conductive fine particles in the conductive coating needed to achieve high conductivity also results in brittle films subject to cracking and poor adherence to the support material.

Fibrous conductive powders comprising, for example, antimony-doped tin oxide coated onto non-conductive potassium titanate whiskers have been used to prepare conductive layers for photographic and electrographic applications. Such materials have been disclosed in U.S. Pat. Nos. 4,845,369, 5,116,66, JP A63009656, and JP A63060452. Layers containing these conductive whiskers dispersed in a binder reportedly provide improved conductivity at lower volume fractions than the aforementioned conductive fine particles as a result of their higher aspect (length to diameter) ratio. However, the benefits obtained as a result of the reduced volume fraction requirements are offset by the fact that these materials are large in size (10 to 20 $\mu$m long and 0.2–0.5 $\mu$m in diameter). The large size results in increased light scattering and hazy coatings. Reducing the size of these particles by various milling methods well known in the art in order to minimize light scattering is not feasible since the milling process erodes the conductive coating and therefore degrades the conductivity of these powders.

Transparent, binderless, electrically semiconductive metal oxide thin films formed by oxidation of thin metal films which have been vapor deposited onto film base are described in U.S. Pat. No. 4,078,935. The resistivity of such conductive thin films has been reported to be $10^5$ $\Omega$/sq. However, these metal oxide thin films are unsuitable for laser printer media applications since the overall process used to prepare them is complex and expensive and adhesion of these thin films to the film base and overlying layers is poor.

Equally as important as the electrically-conductive layer is the thermoplastic dielectric imaging layer which must function in conjunction with the electrically-conductive layer to provide the desired combination of properties. Thus, the present invention is critically dependent on the combined characteristics of the electrically-conductive layer and the imaging layer.

It is toward the objective of providing an improved electroconductive imaging element for use in electrostatographic imaging that the present invention is directed; in particular, an improved electrostatographic imaging element that is substantially free of mottle, has a very low UV-density and very low visible-density and has surface properties which facilitate the uniform deposition of a layer of toner particles and the subsequent formation of an image by imagewise heating of the toner particles.

SUMMARY OF THE INVENTION

This invention provides a novel electroconductive imaging element that is especially adapted for use in a high speed laser printing process which produces an image-bearing element suitable for subsequent use as a master in a UV-imaging process. The laser printing process comprises the steps of:

(1) toner deposition in which a uniform layer of toner particles is deposited on the surface of the electroconductive imaging element;

(2) partial fusion in which the toner particles are adhered to the electroconductive imaging element in an imagewise manner by laser exposure;

(3) differential cleaning in which unfused toner particles are removed from the non-imaged areas of the electroconductive imaging element; and (4) final fusion in which toner particles in the image areas are permanently fused to the electroconductive imaging element.

The electroconductive imaging element of this invention comprises:

(a) an insulating support;

(b) an electrically-conductive layer overlying the support which is comprised of a colloidal gel of vanadium pentoxide dispersed in a polymeric binder, the vanadium pentoxide being present in an amount of at least 3 milligrams per square meter; and (c) a thermoplastic dielectric imaging layer, having a thickness of at least 0.2 micrometers and a surface resistivity of at least $10^{13}$ ohms/square and comprising a thermoplastic polymer with a glass transition temperature of at least 20° C., overlying the electrically-conductive layer.

The electrically-conductive layer in the electroconductive imaging element of this invention has a surface resistivity of $10^7$ ohms per square or less, an internal resistivity of $10^7$ ohms per square or less, a UV $D_{min}$ of less than 0.1 and a visible $D_{min}$ of less than 0.05.

In the electroconductive imaging element of this invention, the electrically-conductive layer and the thermoplastic dielectric imaging layer function together to provide a unique combination of properties that is capable of meeting the stringent requirements of this specific field of electrostatography.

DESCRIPTION OF THE PREFERRED EMBODIMENTS

As hereinabove described, the novel electroconductive imaging element of this invention is particularly useful in an electrostatographic imaging process involving the deposition of a uniform layer of toner particles on the surface of the electroconductive element, imagewise heating of the toner particles to tack them to the surface of the element, removal of the toner particles from the non-image areas, and fusing of the resulting imagewise distribution of toner particles to form the desired image.

Both the characteristics of the electrically-conductive layer and the characteristics of the thermoplastic dielectric imaging layer are critical to successful performance in this process. Use of the imaged element as an imaging master for UV-imaging processes imposes especially severe requirements on the optical characteristics of the element.

In the electroconductive imaging element of this invention, the thermoplastic dielectric imaging layer has a thickness of at least 0.2 micrometers and more preferably a thickness of at least 0.5 micrometers to facilitate the maintenance of uniform capacitance during the toner deposition step and thereby promote uniform toner laydown. Most preferably, the thickness of the thermoplastic dielectric imaging layer is in the range of from about 1 to about 10 micrometers. To facilitate the partial fusion, differential cleaning and final fusion steps, the thermoplastic dielectric imaging layer is comprised of a thermoplastic polymer having a glass transition temperature (Tg) of at least 20° C. and more preferably at least 30° C.

The electrically-conductive layer of the element must combine a high degree of electrical conductivity with a high degree of transparency. In particular, the electrically-conductive layer utilized in the electroconductive imaging element of this invention has (1) a surface resistivity of $10^7$ ohms per square or less and preferably of $5 \times 10^6$ ohms per square or less, (2) an internal resistivity of $10^7$ ohms per square or less and preferably of $5 \times 10^6$ ohms per square or less, (3) a UV $D_{min}$ of less than 0.1 and (4) a visible $D_{min}$ of less than 0.05. Surface resistivity and internal resistivity values as described above are necessary to provide the required uniformity and density of toner deposition. UV $D_{min}$ and visible $D_{min}$ values as described above are necessary to facilitate use as a reproduction image master for exposing products such as lithographic printing plates.

A preferred process for use with the electroconductive element of this invention comprises the steps of:

(1) establishing a bias voltage between the electroconductive element and a magnetic brush applicator;

(2) applying by means of the magnetic brush applicator a uniform layer of toner particles on the surface of the electroconductive element;

(3) exposing the layer of toner particles to a laser beam in an imagewise manner to tack the exposed toner particles to the surface of the electroconductive element;

(4) reversing the bias voltage;

(5) removing the toner particles from non-image areas on the electroconductive element by means of a magnetic brush cleaner; and (6) permanently fusing the imagewise distribution of toner particles to the surface of the electroconductive element.

After imaging by a toner fusion process as described above, the electroconductive imaging element of this invention provides a high quality hard-copy image useful, for example, for diagnostic imaging, transparencies and instrument data recording or plotting. It is especially useful as an image master for the graphic arts industry.

As hereinabove described, the electroconductive imaging element of this invention comprises an insulating support, an electrically-conductive layer overlying the insulating support, and a thermoplastic dielectric imaging layer overlying the electrically-conductive layer.

Insulating supports useful in this invention are well known and widely used in the photographic arts. Typical of useful polymeric film supports are films of cellulose nitrate and cellulose esters such as cellulose triacetate and diacetate, polystyrene, polyamides, homo- and co-polymers of vinyl chloride, poly(vinylacetal), polycarbonate, homo- and co-polymers of olefins, such as polyethylene and polypropylene, and polyesters of dibasic aromatic carboxylic acids with divalent alcohols, such as poly(ethylene terephthalate) and poly(ethylene naphthalate).

Polyester films, such as films of polyethylene terephthalate, have many advantageous properties, such as excellent strength and dimensional stability, which render them especially advantageous for use as supports in the present invention.

The thickness of the insulating support is not critical. Support thicknesses of from 0.04 to 0.4 millimeters can be employed, for example, with satisfactory results.

The electrically-conductive layer utilized in the electroconductive imaging elements of this invention is comprised of a colloidal gel of vanadium pentoxide dispersed in a polymeric binder.

A colloidal gel of vanadium pentoxide has been found to be markedly superior to other well-known electrically-conductive agents in meeting the exceptionally stringent requirements of this invention relating to both transparency and electrical conductivity. Use of a colloidal gel of vanadium pentoxide as an antistatic agent in imaging elements has been described heretofore, for example, in U.S. Pat. No. 4,203,769, issued May 20, 1980, and in U.S. Pat. No. 5,006,451, issued Apr. 9, 1991.

Use in this invention of a colloidal gel of vanadium pentoxide, the preparation of which is described in U.S. Pat. No. 4,203,769, issued May 20, 1980, has many important beneficial advantages. The colloidal vanadium pentoxide gel typically consists of entangled, high aspect ratio, flat ribbons about 50–100 angstroms wide, about 10 angroms thick and about 1000–10000 angstroms long. The ribbons stack flat in the direction perpendicular to the surface when the gel is coated to form a conductive layer. The result is very high electrical conductivities which are typically about three orders of magnitude greater than is observed for layers of similar thickness containing crystalline vanadium pentoxide particles. Low surface resistivities can be obtained with very low vanadium pentoxide coverages. This results in low optical absorption and scattering losses. Also, the coating containing the colloidal vanadium pentoxide gel is highly adherent to underlying support materials.

For use in this invention, it is advantageous that the vanadium pentoxide be doped with a suitable doping agent such as silver. It is important that the coating coverage of vanadium pentoxide be sufficient to provide at least the minimum level of electrical conductivity needed in this invention. This requires an amount of vanadium pentoxide of at least 3 milligrams per square meter. The use of amounts of from 4 to 20 milligrams per square meter is preferred, and from 4 to 12 milligrams per square meter is especially preferred. Because of its fibrous character and excellent conductivity characteristics, a colloidal gel of vanadium pentoxide can be used in this invention in amounts that are far less than is needed for other conductive agents. This provides important advantages in terms of good physical properties and excellent transparency for the electrically-conductive layer.

The polymer in which the vanadium pentoxide is dispersed to form the electrically-conductive layer is not critical. Preferred polymers include a vinylidene chloride/methyl acrylate/itaconic acid terpolymer, a vinylidene chloride/acrylonitrile/methacrylic acid terpolymer or an aqueous dispersible polyester ionomer. Such polymers provide adequate layer integrity and good adhesion to the underlying support material. As a result of the unique fibrous morphology of the vanadium pentoxide, the weight ratio of polymer to vanadium pentoxide in the electrically-conductive layer can range from about 1:5 to about 200:1, more preferably from 1:1 to 10:1. The polymer and the vanadium pentoxide are the only essential ingredients of the electrically-conductive layer but other ingredients such as wetting aids can be incorporated therein to improve coatability.

When a polyester film is utilized as the insulating support, it is generally advantageous to incorporate a polymeric subbing layer between the polyester film and the electrically-conductive layer. Polymeric subbing layers used to promote the adhesion of coating compositions to polyester film supports are very well known in the photographic art. Useful compositions for this purpose include interpolymers of vinylidene chloride such as vinylidene chloride/acrylonitrile/acrylic acid terpolymers or vinylidene chloride/methyl acrylate/itaconic acid terpolymers. Such compositions are described in numerous patents such as for example, U.S. Pat. Nos. 2,627,088, 2,698,235, 2,698,240, 2,943,937, 3,143,421, 3,201,249, 3,271,178, 3,443,950 and 3,501,301.

Polyester ionomers useful in this invention are well known in the art and are described in such patents as U.S. Pat. Nos. 3,456,008, 3,734,874, 4,073,777, 4,233,196, and 4,335,220.

In order to uniformly deposit toner particles onto the surface of the electroconductive imaging element, an electric field is created between the conductive layer and the conductive shell of the magnetic toning brush as a result of an electrical bias of several hundred volts which is applied to the conductive shell of the magnetic brush by a voltage supply. Charged toner particles leave the magnetic brush of the laser printer system and are uniformly applied to the oppositely charged dielectric layer surface. A dielectric layer of at least 0.2 micrometers thickness is required to maintain uniform capacitance during toner deposition. The dielectric layer must be a good insulator to prevent the toner from discharging to the conductive layer, thus preventing uncharged toner particles from falling off the imaging element. The dielectric layer also allows for toner deposition density control by adjustment of the bias voltage level.

The thermal-mechanical properties of the dielectric layer must allow partial fusion of the toner particle to this layer in the imagewise pattern as a result of the thermal energy deposition created by the laser exposure. During the differential cleaning step, the partially fused toner particles must adhere strongly to the dielectric layer. Since a preferred application for the imaging film is as an image master, any removal of the partially fused toner in the laser imaged areas will result in a "pinhole" or image quality defect which will likewise create a defect in the reproduction, such as a lithographic printing plate, prepared from this master. At the same time, however, adhesion of toner to the dielectric layer in an area not exposed to the laser must allow thorough removal of unexposed toner. Any unexposed toner not removed during the differential cleaning step will create a defect in the reproduction created from the image master. Although the dielectric layer must be softened in areas exposed by the laser it must not stick to hot surfaces, such as rollers, during the final fusion step. In addition, the dielectric layer must not adversely affect the optical density of the imaging film and must adhere strongly to the conductive layer.

As previously explained, the most important requirement for the thermoplastic polymer utilized in the thermoplastic dielectric imaging layer is that it have a glass transition temperature (Tg) of at least 20° C. In addition to the polymer, useful addenda for this layer include wetting aids, coalescing aids, and crosslinking agents. Representative polymers for use in the dielectric layer include homopolymers, copolymers and interpolymers of vinyl monomers such as styrenes, acrylates, methacrylates, butadiene, vinylidene chloride, vinyl chloride, acrylonitrile, vinyl esters and vinyl ethers or condensation polymers such as polyurethanes, polycarbonates and polyesters. The dielectric layer can be applied from either organic solvents or aqueous coating formulations.

One of the more difficult problems involved in designing an electroconductive imaging element that is useful in the high speed laser printing process described herein is the need to maintain a very high degree of electroconductivity even though the electrically-conductive layer must be overcoated with the thermoplastic dielectric imaging layer. In using electrically-conductive layers in imaging elements, a common problem is the significant reduction in the degree of electrical conductivity that occurs when the electrically-conductive layer is overcoated. This loss of electrical conductivity can be overcome by using higher concentrations of the electrically-conductive agent, but this leads to less transparent coatings and may also cause serious adhesion problems. The electrically-conductive layer of this invention retains a very high degree of its conductivity after being overcoated with other layers. Thus, it can be coated with the thermoplastic dielectric imaging layer without serious deterioration of its conductive properties. This highly advantageous characteristic provides an electroconductive imaging element in which values for internal resistivity of the electrically-conductive layer, measured in ohms per square, are similar to values for surface resistivity of the electrically-conductive layer, also measured in ohms per square.

The process described herein can be carried out with the use of any of the many dry electrostatographic toners known to the art.

Many polymers have been reported in the literature as being useful in dry electrostatographic toners. Polymers useful in such toners include vinyl polymers, such as homopolymers and copolymers of styrene and condensation polymers such as polyesters and copolyesters. Fusible styrene-acrylic copolymers which are covalently lightly crosslinked with a divinyl compound such as divinylbenzene, as disclosed in the patent to Jadwin et al, U.S. Pat. No. Re. 31,072, are useful. Also useful are polyesters of aromatic dicarboxylic acids with one or more aliphatic diols, such as polyesters of isophthalic or terephthalic acid with diols such as ethylene glycol, cyclohexane dimethanol and bisphenols. Examples are disclosed in the patent to Jadwin et al.

Fusible toner particles used in this invention can have fusing temperatures in the range from about 50° C. to 200° C. Preferred toners fuse in the range of from about 65° C. to 120° C.

Useful toner particles can simply comprise the polymeric particles but, it is often desirable to incorporate addenda in the toner such as waxes, colorants, release agents, charge control agents, and other toner addenda well known in the art.

Charge control agents suitable for use in toners are disclosed for example in U.S. Pat. Nos. 3,893,935, 4,079,014 and 4,323,634 and in British Patent Nos. 1,501,065 and 1,420,839. Charge control agents are generally employed in small quantities such as about 0.1 to about 3 weight percent, often 0.2 to 1.5 weight percent, based on the weight of the toner.

Typical toner particles generally have an average diameter in the range of from 0.1 to 100 micrometers.

The final fusion step of the process can be carried out with conventional fusing means such as heated fusing rollers. Suitable fusing rollers are described in numerous patents, such as, for example, U.S. Pat. Nos. 4,029,827, 4,101,686, 4,185,140, 4,257,699, 4,264,181 and 4,272,179.

Lasers suitable for use in the process described herein are well known in the art and are described, for example, in U.S. Pat. No. 5,138,388.

The invention is further illustrated by the following examples of its practice. Polymeric binders utilized in either the electrically-conductive layer or the dielectric layer in these examples are listed in Table 1 below. Thermoplastic dielectric imaging layers prepared from the polymers identified in Table 1 exhibited a surface resistivity as measured at 20% relative humidity of greater than $10^{13}$ ohms/square. Values for surface resistivity and internal resistivity for the electrically-conductive layer are reported in the examples.

TABLE 1

| Polymer | Description | Tg (°C.) |
| --- | --- | --- |
| P-1 | DuPont ELVACITE 2045 poly(iso-butylmethacrylate) | 55 |
| P-2 | DOW 638 styrene-butadiene latex | 15 |
| P-3 | Styrene/n-butylmethacrylate/sodium sulfoethylmethacrylate (30/60/10 latex) | 41 |
| P-4 | DOW 615 styrene-butadiene latex | 10 |
| P-5 | KODAK AQ 38D polyester ionomer dispersion | 38 |
| P-6 | Methylacrylate/vinylidene chloride/itaconic acid (15/83/2 latex) | 24 |

TABLE 1-continued

| Polymer | Description | Tg (°C.) |
|---|---|---|
| P-7 | Styrene/n-butylmethacrylate/ sodium sulfoethylmethacrylate (10/80/10 latex) | 33 |
| P-8 | KODAK AQ 29D polyester ionomer dispersion | 29 |
| P-9 | KODAK AQ 55D polyester ionomer dispersion | 55 |
| P-10 | Acrylonitrile/vinylidene chloride/acrylic acid (15/79/06 latex) | 45 |
| P-11 | ICI NEOREZ R960 polyurethane dispersion | <0 |

Test images to demonstrate the utility of the present invention were generated using a linear transport device for toner laydown and removal and a rotating drum device for laser imaging. The two devices together provide a model of the laser toner fusing process as detailed in U.S. Pat. No. 5,138,388. Bands of varying toner density were deposited on the test film by stepping the toning station bias voltage as the film moved over the station. Contact of the film conductive layer to machine ground was effected by means of a grounded clip lead attached to a carbon based lacquer stripe applied along one end of the film test strip. In a related test, the efficacy of a given conductive layer resistance was determined by using a fixed toning bias level and measuring transmission density (non)uniformity. The toning bias levels were chosen such that a range of density of about 3.0 and inclusive of 3.5 was obtained. The toned film strip was then mounted on the drum of the exposing device such that the density bands were parallel with the axis of the drum rotation. The toner was partially fused in an imagewise fashion by selective exposure with an 830 nm IR diode laser write head. Laser power output was 110 mW at the film plane with a spot size ($1/e^2$) in the direction parallel to the axis of drum rotation (slow-scan direction) of 27 μm. The translational rate in the slow-scan direction was maintained such that the peak to peak spacing of adjacent circumferential (fast-scan direction) raster line was 14 μm. Selective exposure was effected by modulating the laser between full-on and resting states. Two sets of images were written side-by-side in the slow-scan direction at different drum rpm, typically 120 or 200 rpm. Drum diameter was 16.7 centimeters. Each image was comprised of a strip of solid area, a strip of single pixel raster lines on 200 μm centers, a strip with a nominal 25% dot pattern, six strips featuring from 1 to 6 micropixel dots, and two strips of microscopic pixel patterns arranged such that the strips crossed, perpendicularly, each of the toned density levels.

After exposure the film was remounted onto the platen of the toner laydown and removal device. The non-image toner was removed by two passages at 2.5 cm/sec over a magnetic brush loaded with fresh carrier. The typical electrical bias on the magnetic brush for the first pass was −100 V and that for the second pass was −75 V. Toner removal quality was subjectively evaluated after each pass. The toner removal station was positioned relative to the film sample such that a band of unimaged toner was outside the footprint of the removal station. The unimaged, unfused $D_{max}$ for each of the laydown bias steps was measured using an X-Rite Model 361T densitometer prior to fusing.

Final fusing was accomplished by placing the film sample, image up, on a glass plate in a 125 degree C. oven for 30 seconds. The fused image was evaluated visually, densitometrically, and microscopically across the toner laydown bias levels. The strips containing the 1 to 6 micropixel spots were visually assessed for presence, i.e., survival, and the number of steps present (interpolated to nearest 1/10th of a step) reported as the Dot Holding Index. The imaged and fused solid area, 25% dot nominal pattern, and single pixel lines were measured with the densitometer so as to report the solid area $D_{max}$ value, the actual percent dot area of the 25% input dot pattern, and % of area which is lines for the single pixel lines. Additionally, the single pixel line widths were measured by means of photomicrographs. For comparative purposes, the values measured over the various density steps were interpolated or extrapolated to a nominal $D_{max}$ of 3.5 and that single value reported.

EXAMPLES 1–8

Electrically-conductive layers comprised of a colloidal gel of silver-doped vanadium pentoxide ($V_2O_5$) dispersed in a polymeric binder, as hereinafter described, were hopper coated on 4-mil thick polyethylene terephthalate film support that had been subbed with a terpolymer latex of acrylonitrile, vinylidene chloride and acrylic acid. For purposes of comparison, similar electrically-conductive layers containing other conductive materials, as hereinafter described, were also coated. The coatings were dried at 120° C. and then overcoated with a one micrometer thick thermoplastic dielectric imaging layer. The compositions and total dry coating weights for the electrically-conductive layer are specified in Table 2 below, which also specifies the composition of the dielectric layer. The term "weight ratio" in Table 2 refers to the ratio by weight of the electrically-conductive agent to the polymeric binder in the electrically conductive layer. The term "dielectric polymer" refers to the polymer employed in the thermoplastic dielectric imaging layer.

The surface resistivity of the electrically-conductive layer was measured at 20% relative humidity using a two-point probe. After overcoating the electrically-conductive layer with the dielectric layer, the internal resistivity of the element was measured at 20% relative humidity using the salt bridge method and the UV $D_{min}$ and visible $D_{min}$ were measured using an X-Rite Model 361T densitometer.

Results obtained for examples 1 to 8 are summarized in Table 3 below. For purposes of comparison, results are also reported for Comparative Examples A to I which employed electrically-conductive agents other than the colloidal gel of vanadium pentoxide that is required in the imaging element of this invention. In examples H and I, the electrically-conductive layer provided such high values for UV $D_{min}$ and visible $D_{min}$ that no effort was made to overcoat it with a dielectric layer.

TABLE 2

| Example No. | Composition of Electrically-Conductive Layer | Weight Ratio | Amount of Electrically-Conductive Agent (mg/m$^2$) | Dielectric Polymer |
|---|---|---|---|---|
| 1 | *$V_2O_5$/P-6 | 1/9 | 20 | P-6 |
| 2 | $V_2O_5$/P-6 | 1/9 | 20 | P-11 |
| 3 | $V_2O_5$/P-6 | 1/9 | 10 | P-9 |
| 4 | $V_2O_5$/P-6 | 1/9 | 20 | P-9 |
| 5 | $V_2O_5$/P-6 | 1/9 | 10 | P-6 |
| 6 | $V_2O_5$/P-8 | 1/3 | 4 | P-9 |

TABLE 2-continued

| Example No. | Composition of Electrically-Conductive Layer | Weight Ratio | Amount of Electrically-Conductive Agent (mg/m$^2$) | Dielectric Polymer |
|---|---|---|---|---|
| 7 | V$_2$O$_5$/P-8 | 1/3 | 8 | P-6 |
| 8 | V$_2$O$_5$/P-8 | 1/3 | 14 | P-6 |
| A | CuI/polyvinyl acetate | 1/1 | 500 | P-1 |
| B | **SnO$_2$/gelatin | 85/15 | 600 | P-6 |
| C | SnO$_2$/gelatin | 85/15 | 1200 | P-6 |
| D | SnO$_2$/gelatin | 90/10 | 675 | P-11 |
| E | SnO$_2$/gelatin | 90/10 | 1350 | P-11 |
| F | SnO$_2$/P-6 | 95/5 | 712 | P-11 |
| G | SnO$_2$/P-6 | 95/5 | 1425 | P-11 |
| H | ***WK200/gelatin | 33/67 | 693 | — |
| I | WK200/gelatin | 50/50 | 350 | — |

*The V$_2$O$_5$ (vanadium pentoxide) was silver doped.
**The SnO$_2$ particles were antimony-doped SnO$_2$ particles obtained from KEELING & WALKER, LTD. under the trade name CPM375 and milled to an average particle size of about 70 nanometers.
***These particles were tin-oxide-coated potassium titanate whiskers available as DENTALL WK200 conductive whiskers from OTSUKA CHEMICAL COMPANY.

TABLE 3

| Example No. | Surface Resistivity (ohms/square) | Internal Resistivity (ohms/square) | UV D$_{min}$ | Visible D$_{min}$ | Solid Area D$_{max}$ |
|---|---|---|---|---|---|
| 1 | $3.0 \times 10^6$ | $6.0 \times 10^6$ | 0.093 | 0.025 | 3.4 |
| 2 | $3.0 \times 10^6$ | $3.0 \times 10^6$ | 0.083 | 0.023 | 3.7 |
| 3 | $4.0 \times 10^6$ | $6.3 \times 10^6$ | 0.06 | 0.02 | 3.2 |
| 4 | $3.0 \times 10^6$ | $3.0 \times 10^6$ | 0.087 | 0.024 | 3.5 |
| 5 | $4.0 \times 10^6$ | $8.0 \times 10^6$ | 0.07 | 0.02 | 3.05 |
| 6 | $9.0 \times 10^6$ | $1.0 \times 10^7$ | 0.04 | 0.019 | — |
| 7 | $3.0 \times 10^6$ | $3.0 \times 10^6$ | 0.056 | 0.021 | 3.4 |
| 8 | $1.0 \times 10^6$ | $1.0 \times 10^6$ | 0.088 | 0.031 | — |
| A | $1.0 \times 10^4$ | $1.0 \times 10^4$ | 0.12 | — | 3.8 |
| B | $1.3 \times 10^8$ | $8.0 \times 10^{11}$ | 0.056 | 0.03 | — |
| C | $2.5 \times 10^{10}$ | $1.3 \times 10^{12}$ | 0.058 | 0.037 | — |
| D | $7.1 \times 10^6$ | $4.0 \times 10^{10}$ | 0.056 | 0.03 | — |
| E | $7.0 \times 10^6$ | $4.0 \times 10^{10}$ | 0.052 | 0.028 | 0.4 |
| F | $4.0 \times 10^7$ | $1.2 \times 10^8$ | 0.047 | 0.024 | 1.9 |
| G | $4.0 \times 10^7$ | $1.0 \times 10^8$ | 0.051 | 0.029 | 2.05 |
| H | $3.1 \times 10^6$ | — | 0.17 | 0.099 | — |
| I | $2.0 \times 10^7$ | — | 0.12 | 0.057 | — |

As hereinbefore described, for purposes of this invention, the electrically-conductive layer should have a surface resistivity of $1 \times 10^7$ ohms per square or less, an internal resistivity of $1 \times 10^7$ ohms per square or less, a UV D$_{min}$ of less than 0.1 and a visible D$_{min}$ of less than 0.05. Considering the results in Table 3, it is noted that each of Examples 1 to 8, which utilized vanadium pentoxide in accordance with this invention, provided both a surface resistivity and an internal resistivity of $1 \times 10^7$ ohms per square or less, a UV D$_{min}$ of less than 0.1 and a visible D$_{min}$ of less than 0.05. In contrast with these results, Comparative Example A which used cuprous iodide as the electrically-conductive agent met the requirements for surface resistivity and internal resistivity but not the requirements for UV D$_{min}$ or visible D$_{min}$. Comparative Examples B to G, which used tin oxide as the electrically-conductive agent, met the requirements for UV D$_{min}$ and visible D$_{min}$ but not the requirements for surface resistivity and internal resistivity. Comparative Examples H and I, which used tin-oxide-coated potassium titanate whiskers as the electrically-conductive agent met the requirements for surface resistivity and internal resistivity but not the requirements for UV D$_{min}$ and visible D$_{min}$.

An additional example in which V$_2$O$_5$ and polymer P-8 were employed at a weight ratio of 1 to 3 but the amount of V$_2$O$_5$ was only 2 mg/m$^2$ gave a surface resistivity of $1.2 \times 10^8$ ohms/square, an internal resistivity of $1.3 \times 10^8$ ohms/square, a UV D$_{min}$ of 0.035 and a visible D$_{min}$ of 0.019. In this instance, the vanadium pentoxide was used in too small an amount to provide the necessary degree of electrical conductivity.

It should be noted that electrically-conductive layers comprising tin oxide were unable to meet the resistivity requirements even though the tin oxide constituted as much as 95 weight percent of the electrically-conductive layer and was coated at a level of 1425 mg/m$^2$. (See Comparative Example G). Not only did coatings with this high level of tin oxide fail to meet the resistivity requirements but, because of insufficient polymeric binder, they also exhibited many cracks after drying.

Examples 1 to 8 demonstrate that use of vanadium pentoxide provided solid area D$_{max}$ values of greater than 3.0, as is especially preferred in this invention, while also giving acceptable values for UV D$_{min}$ and visible D$_{min}$. The cuprous iodide used in Comparative Example A gave an acceptable value for solid area D$_{max}$ but an excessively high UV D$_{min}$. The tin oxide used in Comparative Examples E, F and G did not provide adequate conductivity and in consequence gave poor solid area D$_{max}$ values.

EXAMPLES 9–15

Electrically-conductive layers comprising 8 mg/m$^2$ of a colloidal gel of silver-doped vanadium pentoxide dispersed in 24 mg/m$^2$ of polymer P-8 were applied on the aforementioned polyethylene terephthalate film support by hopper coating. Dielectric layers comprising thermoplastic polymers as listed in Table 4 were coated over the electrically-conductive layer at a dry coating thickness of one micrometer. The surface resistivity and internal resistivity values were measured in the manner previously described and ranged from $2 \times 10^6$ to $5 \times 10^6$ ohms per square. The UV D$_{min}$ was measured in the manner previously described and ranged from 0.04 to 0.06. The visible D$_{min}$ was measured in the manner previously described and in each case was below 0.05. The test films were evaluated in a laser toner fusing printer system as described hereinabove and the results obtained are summarized in Table 4 below.

Also reported in Table 4 are results for Comparative Examples J, K and L in which the thermoplastic polymers utilized in the dielectric layers were polymers P-2, P-4 and P-11, respectively, all of which have Tg values of less than the minimum Tg of 20° C. required in this invention.

TABLE 4

| Example No. | Dielectric Polymer | Avg D$_{max}$ 200 rpm | % Dot 25% nominal 200 rpm | Lines % Area 17% nominal 120 rpm | Line Width 27 μm nominal 200 rpm | Dot holding Index (1 = poor, 6 = best) 120 rpm | Dot holding Index (1 = poor, 6 = best) 200 rpm | Removal Results |
|---|---|---|---|---|---|---|---|---|
| 9 | P-3 | 3.3 | 30.9 | 16.5 | 17 | 3.9 | 3.1 | Excellent Cleaning |

TABLE 4-continued

| Example No. | Dielectric Polymer | Avg $D_{max}$ 200 rpm | % Dot 25% nominal 200 rpm | Lines % Area 17% nominal 120 rpm | Line Width 27 μm nominal 200 rpm | Dot holding Index (1 = poor, 6 = best) 120 rpm | Dot holding Index (1 = poor, 6 = best) 200 rpm | Removal Results |
| --- | --- | --- | --- | --- | --- | --- | --- | --- |
| 10 | P-5 | 4.3 | 35.7 | 19.9 | 31 | 4 | 3.2 | Good Cleaning |
| 11 | P-6 | 4.3 | 32.2 | 17 | 25 | 4 | 3.3 | Excellent Cleaning |
| 12 | P-7 | 3.8 | 33.7 | 17.6 | 22 | 3.9 | 3 | Excellent Cleaning |
| 13 | P-8 | 4 | 34.3 | 16.8 | 27 | 4.2 | 3.9 | Good Cleaning |
| 14 | P-9 | 4.5 | 42.7 | 17.7 | 28 | 3.5 | 3 | Good Cleaning |
| 15 | P-10 | 3.7 | 31.7 | 15.2 | 22 | 4 | 3.8 | Good Cleaning |
| J | P-2 | 3.2 | 38.5 | 28.2 | 25 | 4 | 4 | Poor Cleaning |
| K | P-4 | 3.4 | 34.9 | 29.3 | 22 | 4 | 3.2 | Poor Cleaning |
| L | P-11 | — | — | — | 21.8 | 5 | — | Poor Cleaning |

As indicated by the data in Table 4, each of Examples 9 to 15 gave excellent image density and image sharpness while providing very low UV $D_{min}$ and visible $D_{min}$ values. Comparative Examples J, K and L, which utilized thermoplastic polymers with Tg values less than the required 20° C. exhibited poor cleaning and significant image spread that resulted in poor image sharpness.

The invention has been described in detail, with particular reference to certain preferred embodiments thereof, but it should be understood that variations and modifications can be effected within the spirit and scope of the invention.

What is claimed is:

1. An electroconductive imaging element especially adapted for use in a high speed laser printing process which produces an image-bearing element suitable for use as a master in a UV-imaging process, said laser printing process comprising the steps of:
   (1) toner deposition in which a uniform layer of toner particles is deposited on the surface of said electroconductive imaging element,
   (2) partial fusion in which said toner particles are adhered to said electroconductive imaging element in an imagewise manner by laser exposure;
   (3) differential cleaning in which unfused toner particles are removed from the non-imaged areas of said electroconductive imaging element; and
   (4) final fusion in which toner particles in the image areas are permanently fused to said electroconductive imaging element;
   said electroconductive imaging element comprising:
   (a) an insulating support;
   (b) an electrically-conductive layer overlying said support, which is comprised of a colloidal gel of vanadium pentoxide dispersed in a polymeric binder, said vanadium pentoxide being present in said electrically-conductive layer in an amount of at least 3 milligrams per square meter and said electrically-conductive layer having a surface resistivity of $10^7$ ohms/square or less, an internal resistivity of $10^7$ ohms/square or less, a UV $D_{min}$ of less than 0.1 and a visible $D_{min}$ of less than 0.05; and
   (c) a thermoplastic dielectric imaging layer having a thickness of at least 0.2 micrometers overlying said electrically-conductive layer, said thermoplastic dielectric imaging layer having a surface resistivity of at least $10^{13}$ ohms/square and being comprised of a thermoplastic polymer with a glass transition temperature of at least 20° C.

2. An electroconductive imaging element as claimed in claim 1, wherein said vanadium pentoxide is present in said electrically-conductive layer in an amount of from 4 to 20 milligrams per square meter.

3. An electroconductive imaging element as claimed in claim 1, wherein said vanadium pentoxide is present in said electrically-conductive layer in an amount of from 4 to 12 milligrams per square meter.

4. An electroconductive imaging element as claimed in claim 1, wherein said thermoplastic dielectric imaging layer has a thickness of at least one micrometer.

5. An electroconductive imaging element as claimed in claim 1, wherein said thermoplastic polymer has a glass transition temperature of at least 30° C.

6. An electroconductive imaging element as claimed in claim 1, wherein said electrically-conductive layer has a surface resistivity of $5 \times 10^6$ ohms/square or less and an internal resistivity of $5 \times 10^6$ ohms/square or less.

7. An electroconductive imaging element as claimed in claim 1, wherein said insulting support is a polyester film.

8. An electroconductive imaging element as claimed in claim 1, wherein said insulting support is a film composed of poly(ethylene terephthalate) or poly(ethylene naphthalate).

9. An electroconductive imaging element as claimed in claim 1, wherein said vanadium pentoxide is doped with silver.

10. An electroconductive imaging element as claimed in claim 1, wherein the weight ratio of polymer to vanadium pentoxide in said electrically-conductive layer is in the range of from 1:1 to 10:1.

11. An electroconductive imaging element as claimed in claim 1, wherein said polymer in said electrically-conductive layer is a vinylidene chloride/methyl acrylate/itaconic acid terpolymer.

12. An electroconductive imaging element as claimed in claim 1, wherein said polymer in said electrically-conductive layer is a vinylidene chloride/acrylonitrile/methacrylic acid terpolymer.

13. An electroconductive imaging element as claimed in claim 1, wherein said polymer in said electrically-conductive layer is an aqueous dispersible polyester ionomer.

14. An electroconductive imaging element as claimed in claim 1, wherein said polymer in said thermoplastic dielectric imaging layer is a methyl acrylate/vinylidene chloride/itaconic acid terpolymer.

15. An electroconductive imaging element as claimed in claim 1, wherein said polymer in said thermoplastic dielectric imaging layer is a polyurethane.

16. An electroconductive imaging element as claimed in claim 1, wherein said polymer in said thermoplastic dielectric imaging layer is an aqueous dispersible polyester ionomer.

* * * * *